(12) United States Patent
Bershteyn et al.

(10) Patent No.: US 8,612,201 B2
(45) Date of Patent: Dec. 17, 2013

(54) HARDWARE EMULATION SYSTEM HAVING A HETEROGENEOUS CLUSTER OF PROCESSORS

(75) Inventors: Mikhail Bershteyn, Cupertino, CA (US); Mitchell G. Poplack, San Jose, CA (US); Beshara G. Elmufdi, Sunnyvale, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 1257 days.

(21) Appl. No.: 11/401,641

(22) Filed: Apr. 11, 2006

(65) Prior Publication Data

US 2007/0239422 A1    Oct. 11, 2007

(51) Int. Cl.
    *G06F 9/455* (2006.01)
(52) U.S. Cl.
    USPC .......................................................... 703/28
(58) Field of Classification Search
    USPC ........................................................... 703/28
    See application file for complete search history.

(56) References Cited

U.S. PATENT DOCUMENTS

| | | | | |
|---|---|---|---|---|
| 4,674,033 A | * | 6/1987 | Miller | 711/151 |
| 4,969,117 A | * | 11/1990 | Miranker | 708/441 |
| 5,233,701 A | * | 8/1993 | Nakata | 711/153 |
| 5,388,233 A | * | 2/1995 | Hays et al. | 712/208 |
| 5,410,723 A | * | 4/1995 | Schmidt et al. | 712/18 |
| 5,471,593 A | * | 11/1995 | Branigin | 712/235 |
| 5,551,013 A | | 8/1996 | Beausoleil et al. | |
| 5,701,507 A | * | 12/1997 | Bonneau et al. | 716/124 |
| 5,721,828 A | * | 2/1998 | Frisch | 709/217 |
| 5,761,484 A | | 6/1998 | Agarwal et al. | |
| 5,781,921 A | * | 7/1998 | Nichols | 711/115 |
| 5,802,348 A | | 9/1998 | Stuart et al. | |
| 5,841,967 A | | 11/1998 | Sample et al. | |
| 5,845,322 A | * | 12/1998 | Leung | 711/151 |
| 6,058,492 A | | 5/2000 | Sample et al. | |
| 6,141,636 A | * | 10/2000 | Sarno et al. | 703/23 |
| 6,513,057 B1 | * | 1/2003 | McCrory | 718/102 |
| 6,618,698 B1 | | 9/2003 | Beausoleil et al. | |
| 7,089,538 B1 | * | 8/2006 | Beausoleil et al. | 717/134 |

(Continued)

FOREIGN PATENT DOCUMENTS

EP    0 849 672 A2    6/1998
JP    10171847 A    6/1998

(Continued)

OTHER PUBLICATIONS

M. Morris Mano, "Computer System Architecture", second edition, 1982, Prentice-Hall, pp. 270-327.*

(Continued)

*Primary Examiner* — Kamini S Shah
*Assistant Examiner* — Russ Guill
(74) *Attorney, Agent, or Firm* — Holland & Knight LLP; Mark H. Whittenberger, Esq.

(57) ABSTRACT

A hardware emulation system having a heterogeneous cluster of processors is described. The apparatus for emulating a hardware design comprises a plurality of processors, where each processor performs a different function during an emulation cycle. The method performed by the apparatus comprises using a data fetch processor to retrieve data from a data array, evaluating the retrieved data using the data fetch processor to produce an output bit, supplying the output bit to an intracluster crossbar and using a data store processor to store the output bit in the data array.

13 Claims, 7 Drawing Sheets

(56) References Cited

U.S. PATENT DOCUMENTS

| | | |
|---|---|---|
| 7,146,582 B2 | 12/2006 | Kimura et al. |
| 7,257,665 B2 * | 8/2007 | Niell et al. .................... 711/101 |
| 7,464,227 B2 * | 12/2008 | Edirisooriya et al. ........ 711/144 |
| 2005/0013705 A1 * | 1/2005 | Farkas et al. .................. 417/393 |
| 2007/0180182 A1 * | 8/2007 | Gostin et al. .................. 710/317 |

FOREIGN PATENT DOCUMENTS

| | | |
|---|---|---|
| JP | 10326189 A | 12/1998 |
| JP | 2002018819 A | 1/2002 |
| JP | 2004246402 A | 9/2004 |
| JP | 2008263323 A | 10/2008 |
| WO | 90/04233 | 4/1990 |

OTHER PUBLICATIONS

M. Morris Mano et al., "Logic and Computer Design Fundamentals", 2004, Pearson Prentice Hall, pp. 557-565.*

John D. Davis et al., "A chip prototyping substrate: the flexible architecture for simulation and testing (FAST)", Sep. 2005, ACM SIGARCH Computer Architecture News, vol. 33, No. 4, pp. 34-43.*

N. Jagadish et al., "An efficient scheme for interprocessor communication using dual-ported RAMs," 1989, IEEE Micro, vol. 9, issue 5, pp. 10-19.*

Robert J. Gove, "The multimedia video processor (MVP): a chip architecture for advanced DSP applications," 1994, 1994 Sixth IEEE Digital Signal Processing Workshop, pp. 27-30.*

* cited by examiner

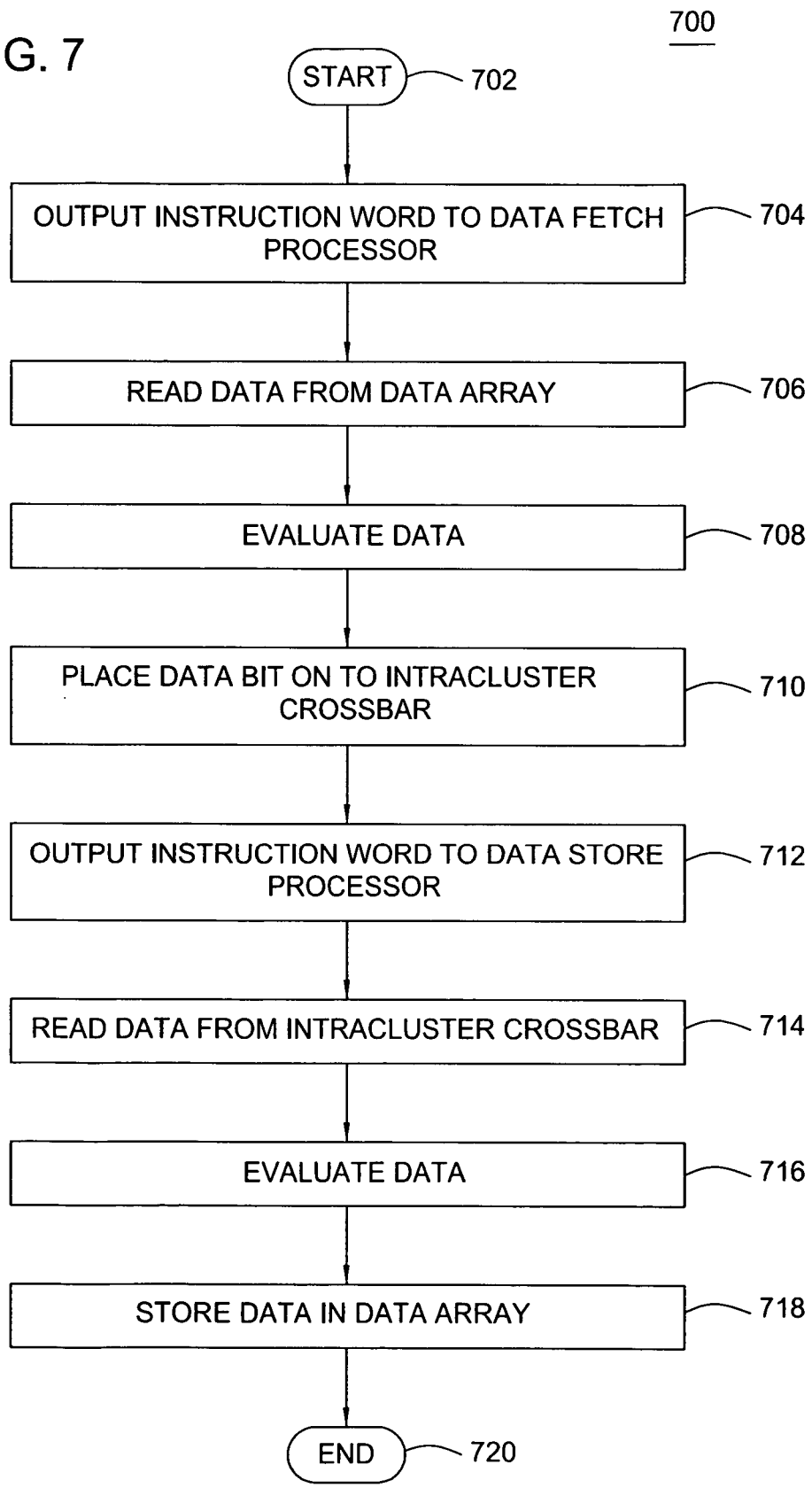

HARDWARE EMULATION SYSTEM HAVING A HETEROGENEOUS CLUSTER OF PROCESSORS

BACKGROUND OF THE INVENTION

1. Field of the Invention

Embodiments of the present invention generally relate to a processor based hardware emulation system and, more particularly, to a heterogeneous processor based hardware emulation system.

2. Description of the Related Art

Hardware emulators are programmable devices used to verify hardware designs. A common method of hardware design verification is to use processor-based hardware emulators to emulate the design prior to physically manufacturing the integrated circuit(s) of the hardware. These processor-based emulators sequentially evaluate combinatorial logic levels, starting at the inputs and proceeding to the outputs. Each pass through the entire set of logic levels is known as a cycle; the evaluation of each individual logic level is known as an emulation step.

An exemplary hardware emulator is described in commonly assigned U.S. Pat. No. 6,618,698 titled "Clustered Processors In An Emulation Engine", which is hereby incorporated by reference in its entirety. Hardware emulators allow engineers and hardware designers to test and verify the operation of an integrated circuit, an entire board of integrated circuits, or an entire system without having to first physically fabricate the hardware.

The complexity and number of logic gates present on an integrated circuit has increased significantly in the past several years. Hardware emulators need to improve in efficiency to keep pace with the increased complexity of integrated circuits. The speed with which a hardware emulator can emulate an integrated circuit is one of the most important benchmarks of the emulator's efficiency, and also one of the emulator's most important selling factors in the emulator market.

Conventional hardware emulators are comprised of identical processors. The processors are generally arranged into groups of processors known as clusters. In a conventional hardware emulator, each processor performs an identical set of functions, i.e., retrieving data from a memory, evaluating the data, and writing the processed result back to the memory. Processors address the memory via an instruction word. The instruction word is stored in a special instruction memory and contains a read address for the data to be evaluated and a Boolean function table that instructs the processor on how to evaluate the data. The processor then stores the produced result back to the same memory location as indicated by the instruction address.

The amount of memory required by a conventional hardware emulator is directly dependent on the number of processors present in the hardware emulator. Specifically, the hardware emulator must contain a memory that is at least equal to the number of processors multiplied by the depth of the instruction memory. The instruction word must contain several address fields to enable the processor to address any location within the memory. Also, during each instruction execution cycle, each processor must perform numerous energy-consuming read and write accesses to the memory.

Thus, there is a need in the art for a hardware emulator that contains more processors than a conventional hardware emulator but does not require substantially more memory.

SUMMARY OF THE INVENTION

The present invention generally relates to an improved processor-based emulation engine. The apparatus for emulating a hardware design comprises a plurality of processors that form at least one heterogeneous cluster of processors, where each processor in a cluster performs a different function during an emulation cycle. The method performed by the apparatus comprises using a data fetch processor to retrieve data from a data array, evaluate the retrieved data using the data fetch processor to produce an output bit, supply the output bit to an intracluster crossbar and use a data store processor to store the output bit in the data array.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 7 is a flow diagram of a method that can be utilized by one embodiment of the present invention;

DETAILED DESCRIPTION

The present invention is an improved method and apparatus that uses a heterogeneous duster of processors to increase the efficiency of an emulation engine. An exemplary emulation engine is disclosed in U.S. Pat. No. 6,618,698 "Clustered Processors In An Emulation Engine" and U.S. Pat. No. 5,551,013 "Multiprocessor For Hardware Emulation" which are hereby incorporated by reference in their entirety.

Figure 1:
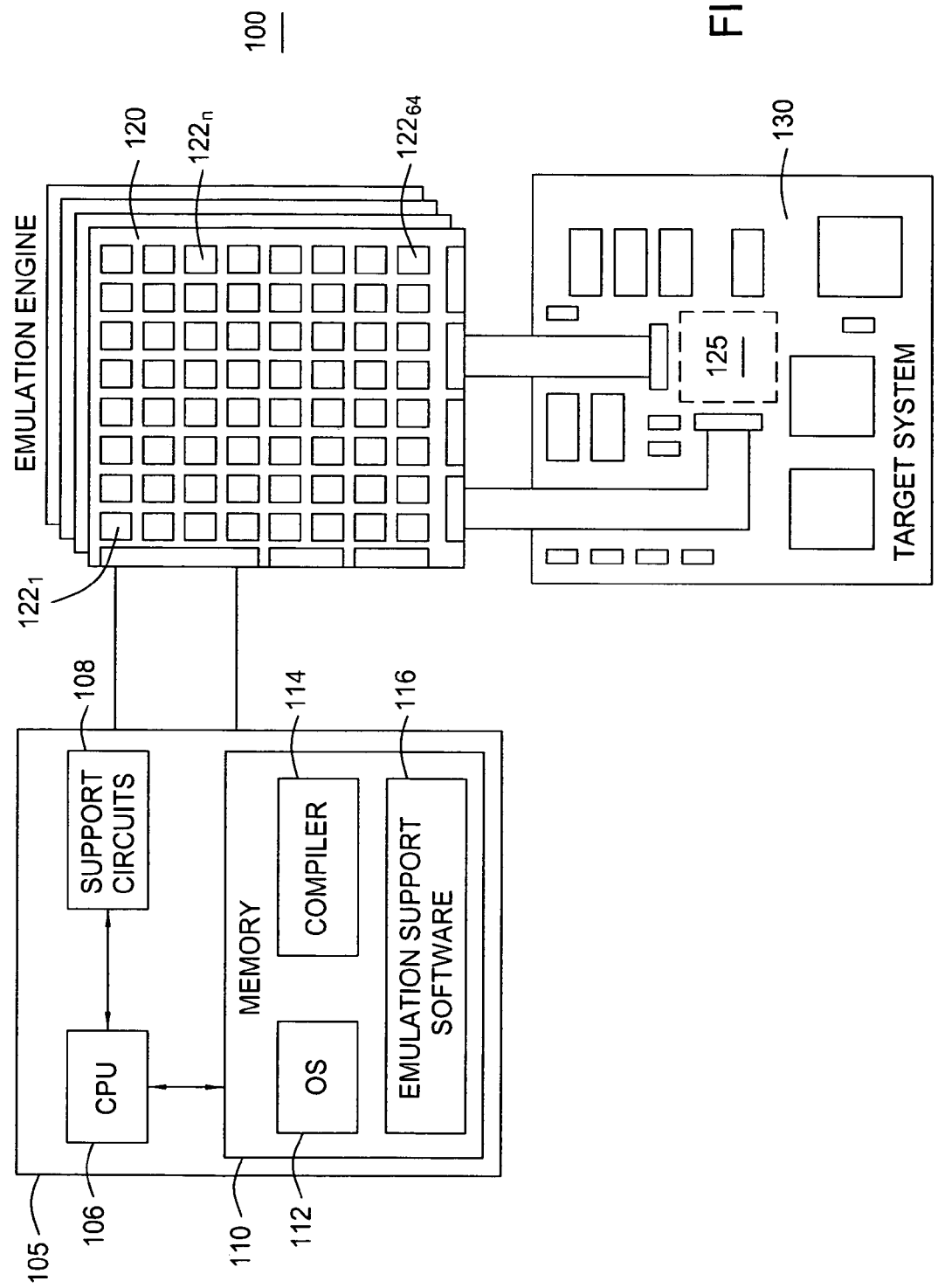
FIG. 1 is a general overview of a hardware emulation system.

FIG. 1 depicts an overview of an emulation system 100. The system comprises a computer workstation 105, an emulation board 120 and a target system 130. The computer workstation 105 provides emulation support facilities to the emulation board 120.

The computer workstation 105 comprises at least one central processing unit (CPU) 106, support circuits 108 and a memory 110. The CPU 106 may comprise one or more conventionally available microprocessors and/or microcontrollers. The support circuits 108 are well known circuits that are used to support the operation of the CPU 106. These circuits comprise power supplies, clocks, input/output interface circuitry, cache and the like.

Memory 110 may comprise random access memory, read only memory, removable disk memory, flash memory, optical storage and various combinations of these types of memory. The memory 110 is sometimes referred to as main memory and may in part be used as cache memory or buffer memory. The memory 110 stores various forms of software and files, such as an operating system (OS) 112, a compiler 114, and emulation support software 116.

The compiler 114 converts a hardware design, e.g., hardware described in VHDL or Verilog, to a sequence of instructions that can be evaluated by the emulation board 120.

The computer workstation 105 allows a user to interface with the emulation board 120, control the emulation process and collect emulation results for analysis. The emulation board 120 is composed of individual emulation chips $122_1$ to $122_{64}$ (collectively 122). Under control of the computer workstation 105, programming information and data is loaded to the emulation board 120.

In response to the programming received from the emulation support software 116, the emulation board 120 emulates a portion 125 of the target system 130. The portion 125 of the target system 130 may be an integrated circuit, a memory, a processor, or any object or device that can be emulated in a programming language. Popular emulation programming languages include Verilog and VHDL.

Figure 2:
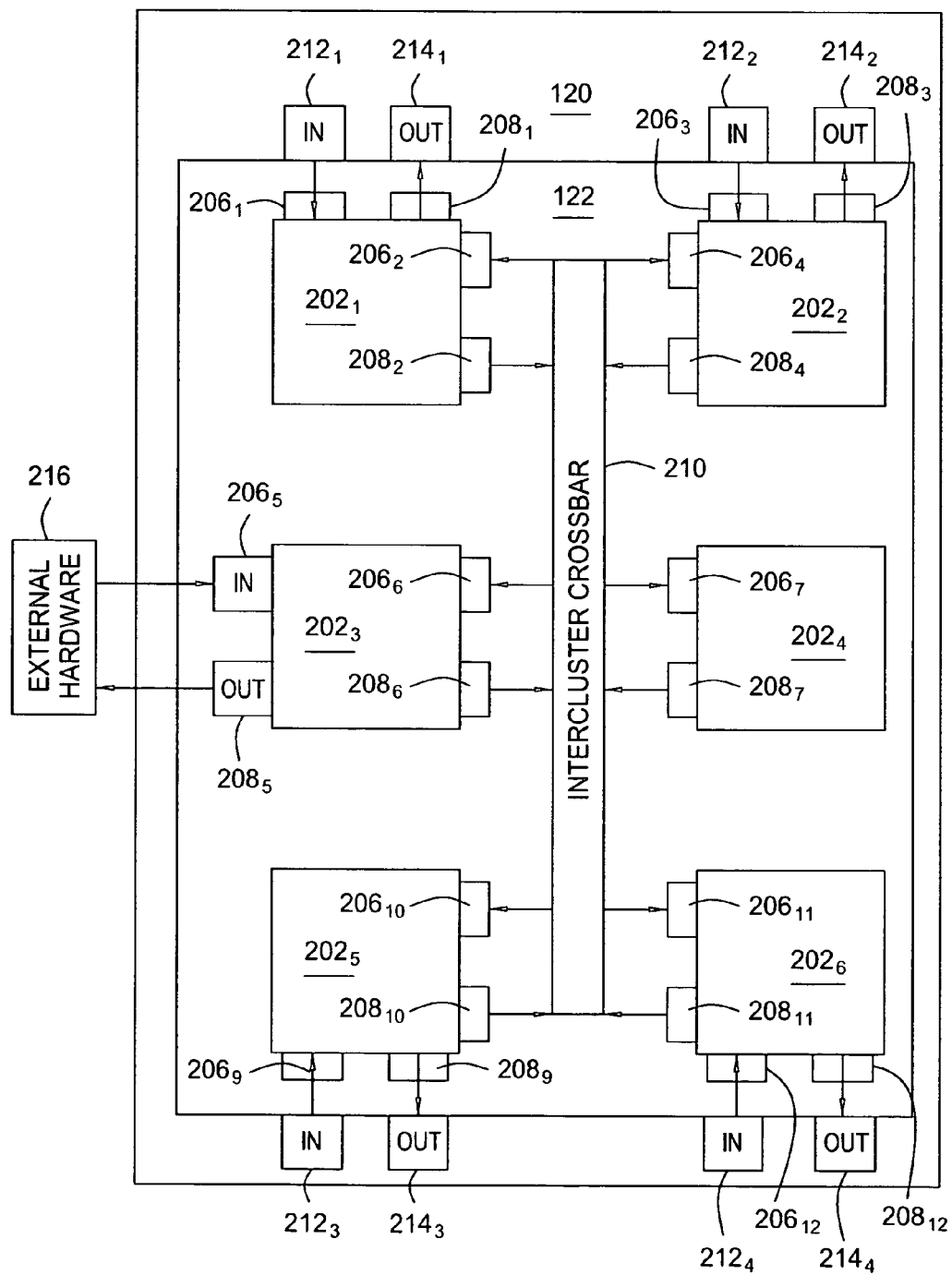
FIG. 2 is a block diagram of a hardware emulation chip.

FIG. 2 depicts an expanded view of an emulation chip 122 that is utilized by the emulation board 120. The emulation chip 122 comprises heterogeneous clusters of processors $202_1$ to $202_6$ (collectively 202) capable of communicating with each other via an intercluster crossbar 210. Each heterogeneous cluster of processors 202 has at least one input $206_1$ to $206_7$ and $206_9$ to $206_{12}$ (collectively 206) and at least one output $208_1$ to $208_7$ and $208_9$ to $208_{12}$ (collectively 208). The input 206 and output 208 allows the heterogeneous cluster of processors 202 to communicate with other heterogeneous clusters of processors 202 via the intercluster crossbar 210, other emulation chips via external connectors 212 and 214, and external hardware 216. The external hardware 216 may be a Very Large Scale Integration (VLSI) circuit, A debugger, a memory, or any combination of hardware and software from which the emulation chip 122 can benefit. The emulation chip 122 has input connectors $212_1$ to $212_4$ (collectively 212) for receiving data from other emulation chips and output connectors $214_1$ to $214_4$ (collectively 214), known as chip pads, for supplying data to other emulation chips.

Figure 3:
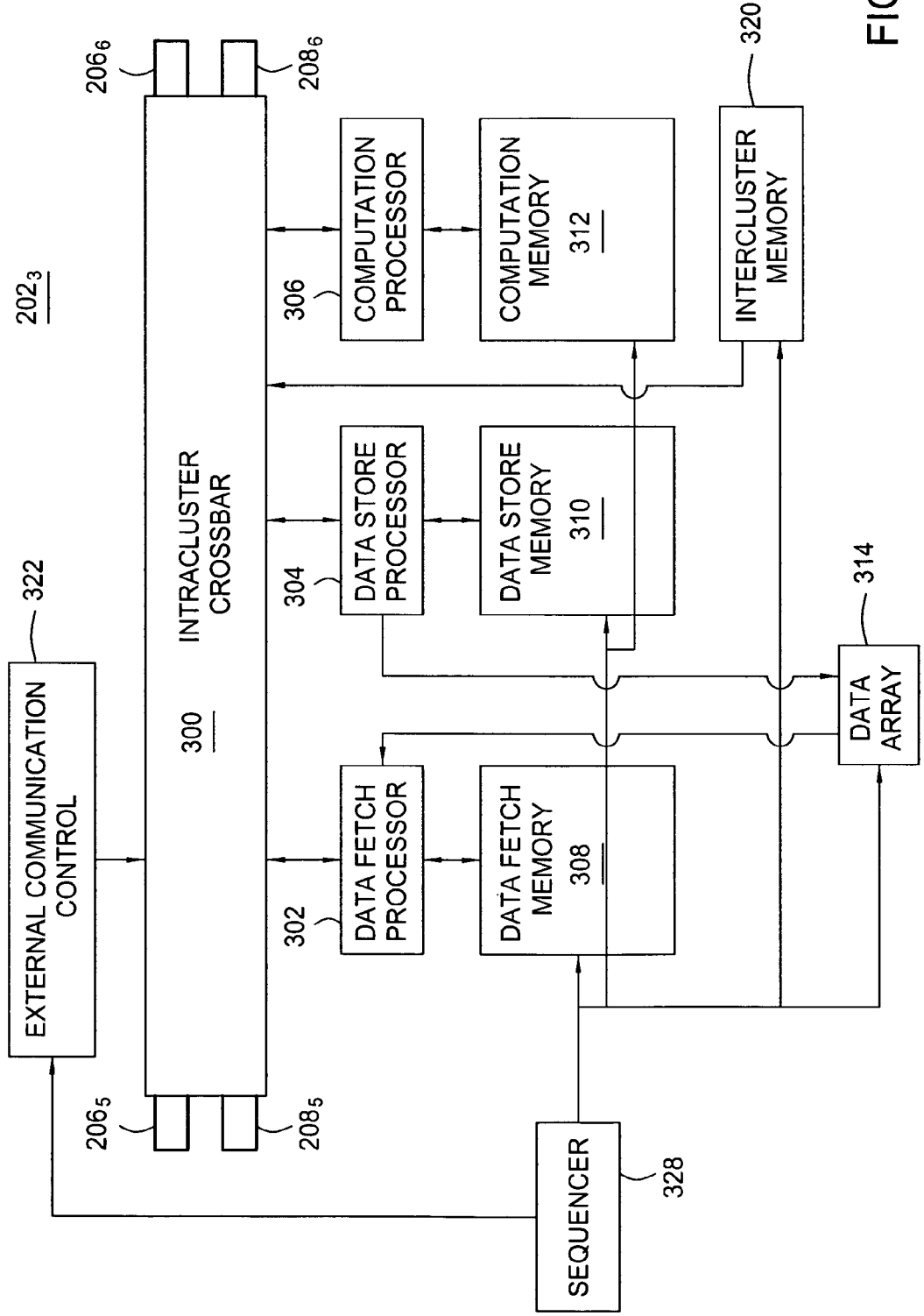
FIG. 3 is a block diagram of a heterogeneous cluster of processors.

FIG. 3 depicts a block diagram of one of the heterogeneous clusters of processors, $202_3$, depicted in FIG. 2. The cluster $202_3$ is defined as heterogeneous because each of the processors 302/304/306 within the cluster 202 performs a different function. Each processor 302/304/306 plays a unique role in the retrieval, evaluation, and storage of data within the duster 202. For example, only a data fetch processor 302 is capable of retrieving data from a data array 314 and only a data store processor 306 is capable of writing processed data to the data array 314.

The duster 202 comprises at least one data fetch processor 302 and its associated data fetch instruction memory 308, at least one data store processor 304 and its associated data store instruction memory 310, an intracluster crossbar 300, a data array 314, a sequencer 328, an external communication control 322 and an intercluster memory 320. The cluster 202 also includes a computation processor 306 and its associated computation instruction memory 312. As shall be discussed below, the computation processor 306 and its memory 312 are optional components.

The sequencer 328 is connected to the data array 314, the data fetch instruction memory 308, data store instruction memory 310, computation instruction memory 312, intercluster memory 320 and external communication control 322. The sequencer 328 provides timing information to the cluster 202, provides sequential write addresses to the data array 314, and causes the data fetch instruction memory 308, data store instruction memory 310 and computation instruction memory 312 to sequentially output instruction words (shown in FIG. 4-6). The instruction words control the operation of their respective processors, i.e., an instruction word produced by the data fetch instruction memory 308 controls the operation of the data fetch processor 302, an instruction word produced by the data store instruction memory 310 controls the operation of the data store processor 304, and the instruction word produced by the computation instruction memory controls the operation of the computation processor 306. The sequencer 328 also controls the operation of the intercluster memory 320 and the external communication control 322 by providing sequential instruction addresses to the intercluster memory 320 and external communication control 322. The instruction memories 308/310/312 store instruction words that are sequentially and repetitively provided to their respective processors 302/304/306 under the control of the sequencer 328. Each increment of the sequencer 328 causes the step value to advance from zero to a predetermined maximum value and corresponds to one design path clock cycle for the emulated design.

The processors 302/304/306 are a fundamental component of the emulation engine 120. The processors' primary function is to work together to execute an N-input logical function (where N is an integer) and produce a function bit out during each step of the sequencer 328. The inputs for each logic function can be selected from a variety of sources, including bits stored from a previous operation, or from another one or more processors. The resulting function bit out may correspond to any one of: a logic gate output of the emulated design, a register output of the emulated design, a synthesized intermediate logic state, or a control bit generated for the emulation process. In a conventional emulation engine, each of the processors are identical to each other and are capable of performing identical functions. In the present invention, each of the processors 302/304/306 plays a unique role in the operation of the emulation engine 120. Thus, the clusters 202 that form the emulation engine 120 are considered heterogeneous.

The data fetch processor 302 receives an instruction word from its associated data fetch processor memory 308. The instruction word comprises a read address for a location in the data array 314. The data fetch processor 302 retrieves data from the data array 314 using the read address provided by the instruction word. The instruction word also includes an operating instruction for evaluating the data retrieved from the data array 314. The data fetch processor 302 evaluates the data in accordance with the instruction word and produces an output bit. The data fetch processor 302 writes the output bit to the intracluster crossbar 300.

The data store processor 304 receives an instruction word from its associated data store processor memory 310. The instruction word enables the data store processor 304 to select data from the intracluster crossbar 300. The instruction word also includes an operating instruction for evaluating the data retrieved from the intracluster crossbar 300. The data store processor 304 evaluates the data in accordance with the instruction word and produces an output bit. The data store processor 304 writes the output bit back to the intracluster crossbar 300 and to the data array 314. The output bit is stored in the data array 314 at a write address provided by the sequencer 328. In another embodiment of the invention, the output bit is stored at a write address in the data array 314 that is specified by a field in the data store processor instruction word.

The computation processor 306 receives an instruction word from its associated computation instruction memory 312. The instruction word enables the computation processor 306 to select data from the intracluster crossbar 300. The instruction word also includes an operating instruction for evaluating the data retrieved from the intracluster crossbar 300. The computation processor 306 evaluates the data in accordance with the instruction word and produces an output bit. The computation processor 306 writes the output bit back to the intracluster crossbar 300.

The computation processor 306 and its associated computation instruction memory 312 are optional and not necessary for the present invention to function. The computation processor 306 cannot address the data array 314, nor can it write processed data to the data array 314. The computation processor 306 can only address the intracluster crossbar 300. Therefore, the computation processor 306 and its associated computation instruction memory 312 is not necessary for the operation of the heterogeneous cluster of processors 202. However, the computation processor 306 increases the amount of data the cluster 202 can evaluate in one instruction cycle.

The intracluster crossbar 300 enables the processors 302/304/306 to communicate with each other. The processors 302/304/306 evaluate data and write the output bit to the intracluster crossbar 300. A processor 302/304/306 can retrieve the data from the intracluster crossbar 300 without having to retrieve the data from the data array 314. In one embodiment of the invention, the intracluster crossbar 300 is comprised of at least one multiplexer. The intracluster crossbar 300 has an external input $206_5$ and an external output $208_5$ that connects the duster 202 to external hardware 216; an external input $206_6$ and an external output $208_6$ that connects to the intercluster crossbar 210.

The intercluster memory 320 stores control bits used to select data from the intercluster crossbar 210 and from intracluster crossbar 300. The sequencer 328 causes the intercluster memory 320 to output "control bits" to the intracluster crossbar 300. An output bit is selected using the "control bits" provided by the intercluster memory 320 and written to the intercluster crossbar 210 via external output $208_6$. Another set of control bits is provided to the intercluster crossbar 210 to select the data acquired into intracluster crossbar 300 via external input $206_6$.

The external communication control 322 stores "control bits" used to select data from the intracluster crossbar 300. The sequencer 328 causes the external communication control 322 to output "control bits" to the intracluster crossbar 300. An output bit is selected using the "control bits" provided by the external communication control 322 and written to the external hardware 216 via external output 208. Another set of control bits enables the acquisition of data from external hardware 216 into intracluster crossbar 300 via external input $206_5$.

The operation and timing of the heterogeneous cluster of processors 202 is controlled by the sequencer 328. Each increment of the sequencer 328 from zero to the maximal value of the sequencer 328 is known as an emulation step. During each emulation step, the sequencer 328 causes the instruction memories 308/310/312 to provide instruction words (shown in FIG. 4-6) to their associated processors, 302/304/306 respectively. Each emulation step results in data being retrieved from the data array 314 by the data fetch processor 302, evaluated by the data fetch processor 302, and then stored back into the data array 314 by the data store processor 304.

Figure 4:
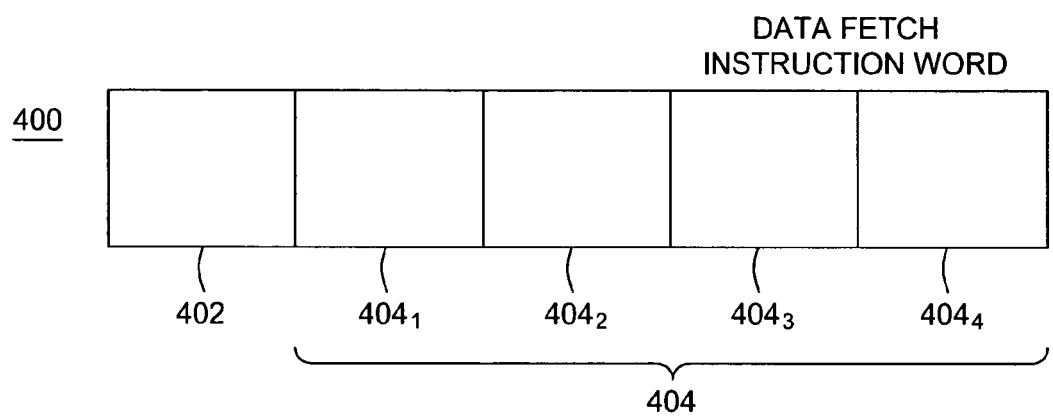
FIG. 4 is a diagram of a data fetch instruction word.

FIG. 4 represents one embodiment of a data fetch instruction word 400. The data fetch instruction word 400 is stored in the data fetch memory 308. In one embodiment, the data fetch instruction word 400 comprises a Boolean table function field 402 and a plurality of address fields $404_1$ to $404_4$ (collectively 404). The size of the Boolean table function field 402 is determined by two raised to the power of the number of address fields. In the present embodiment there are four address fields $404_1$ to $404_4$, therefore the Boolean function table field 402 contains sixteen bits. Each address field 404 has 12 bits. Therefore, the total length of the data fetch instruction word 400 is sixty-four bits. One skilled in the art will appreciate the length of the data fetch instruction word 400 is dependent on the size of the Boolean function table field 402 and the size of the address field 404. The data fetch instruction word 400 may be smaller or larger than sixty-four bits.

The data fetch processor 302 uses the data fetch instruction word 400 to retrieve data from the data array 314. The address fields 404 provide a read address for the data array 314. The data fetch processor 302 evaluates the data supplied by the data array 314 using the Boolean function table field 402 to produce an output bit.

Figure 5:
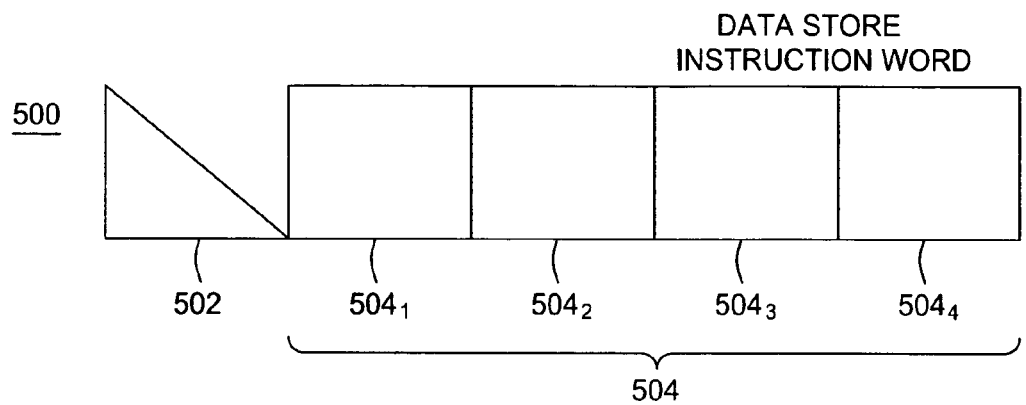
FIG. 5 is a diagram of a data store instruction word.

FIG. 5 represents one embodiment of a data store instruction word 500. The data store instruction word 500 is stored in the data store memory 310. The data store instruction word 500 comprises a Boolean table function field 502 and a plurality of computation operand address fields $504_1$ to $504_4$ (collectively 504). The Boolean table function field 502 in the data store instruction word 500 contains the same information as Boolean table function field 402 in data fetch instruction word 400. The computation operand address fields 504 are smaller in size than the address fields 404 in the data fetch instruction word 400 because they only need to address the intracluster crossbar (ICCB) 300 and not the full data array 314.

The data store processor 304 uses the data store instruction word 500 to retrieve data from the ICCB 300. The address fields 504 provide a read address for the ICCB 300. The data store processor 304 evaluates the data supplied by the ICCB 300 using the Boolean function table field 502 to produce an output bit.

Figure 6:
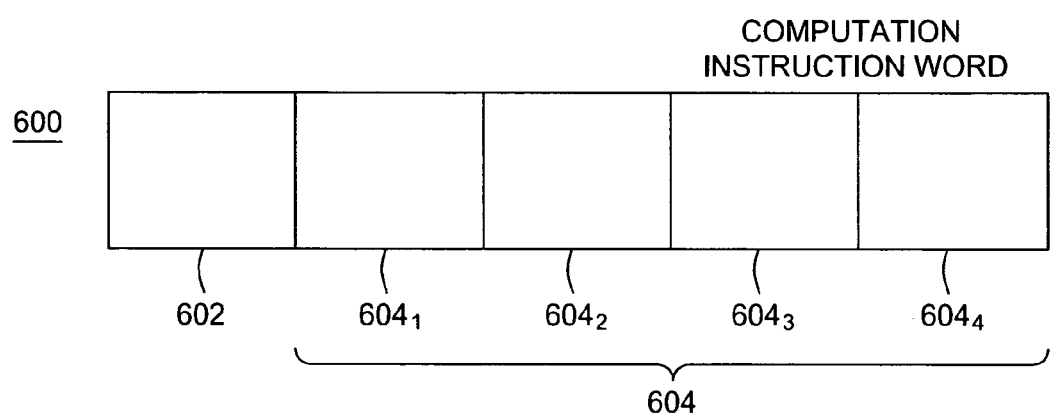
FIG. 6 is a diagram of a computation instruction word.

FIG. 6 represents one embodiment of a computation instruction word 600. The computation instruction word 600 is stored in the computation memory 312. The computation instruction word 600 comprises a Boolean table function field 602 and a plurality of computation operand address fields $604_1$ to $604_4$ (collectively 604). The Boolean table function field 602 in the computation instruction word 600 contains the same information as Boolean table function field 402 in data fetch instruction word 400. The computation operand address fields 604 are smaller in size than the address fields 404 in the data fetch instruction word 400 because they only need to address the intracluster crossbar (ICCB) 300 and not the full data array 314.

The computation processor 306 uses the computation instruction word 600 to retrieve data from the ICCB 300. The address fields 604 provide a read address for the ICCB 300. The computation processor 306 evaluates the data supplied by the ICCB 300 using the Boolean function table field 602 to produce an output bit.

FIG. 7 depicts a flow diagram of a method 700 that details the operation of the heterogeneous cluster of processors 202 in accordance with one embodiment of the present invention. The method 700 starts at block 702 and proceeds to block 704. At block 704, a sequencer 328 causes a data fetch memory 308 to output a data fetch instruction word 400 to its associated data fetch processor 302. At block 706, the data fetch processor 302 reads data from a data array 314 using a read address $404_1$-$404_4$ supplied by the data fetch instruction word 400. At block 708, the data fetch processor 302 evaluates the data using a Boolean function table 402 that is a part of the data fetch instruction word 400.

At block 710, the data fetch processor 302 produces a data bit that is a result of the data evaluation and places the bit onto an intracluster crossbar (ICCB) 300. At block 712, the sequencer 328 causes a data store memory 310 to output a data store instruction word 500 to a data store processor 304. At block 714, the data store processor 304 reads data from the ICCB 300 using a read address $504_1$-$504_4$ supplied by the data store instruction word 500. At block 716, the data store processor 304 evaluates the data using a Boolean function table 502 that is a part of the data store instruction word 500. At block 718, the data store processor 304 produces a data bit that is a result of the data evaluation and writes it to the data array 314. In one embodiment of the invention, the data bit is written to the same address produced by the sequencer 328 from which the data fetch processor 302 retrieved the instruction word. The method ends at block 720.

Figure 8:
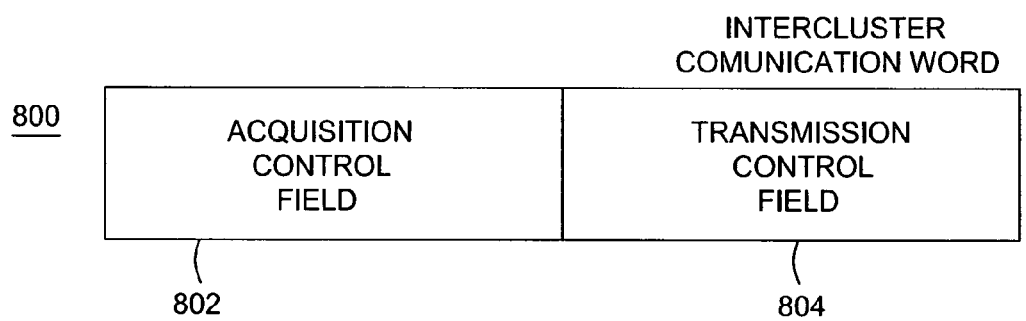
FIG. 8 is a diagram of an intercluster communication instruction word.

FIG. 8 represents one embodiment of an intercluster communication word 800. The intercluster communication word 800 is stored in the intercluster memory 320. The intercluster communication word 800 comprises an acquisition control field 802 and a transmission control field 804. The transmission control field 804 addresses the ICCB 300 and selects data to be transmitted to the intercluster crossbar 210. In one embodiment of the invention, the intercluster crossbar 210 is comprised of at least one multiplexer. The acquisition control field 802 is used to make a selection inside the intercluster crossbar of the bit of data that should be acquired into the ICCB 300. The bit is provided by the ICCB 300 of another heterogeneous cluster of processors 202 within the emulation engine 120 via the intercluster crossbar 210.

Figure 9:
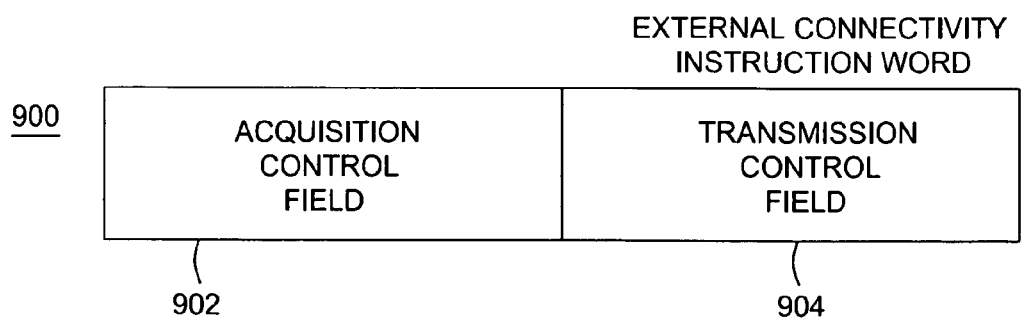
FIG. 9 is a diagram of an external connectivity instruction word.

FIG. 9 represents one embodiment of an external connectivity word 900. The external connectivity word 900 is stored in external connectivity memory 322. The external connectivity word 900 includes an acquisition control field 902 and a transmission control field 904. In one embodiment, the acquisition control field 902 is only one bit and enables data to be selected from the external hardware 216. The transmission control field 904 is used to select the data and produce an output bit. This output bit is then transmitted to the external hardware 216.

Figure 10:
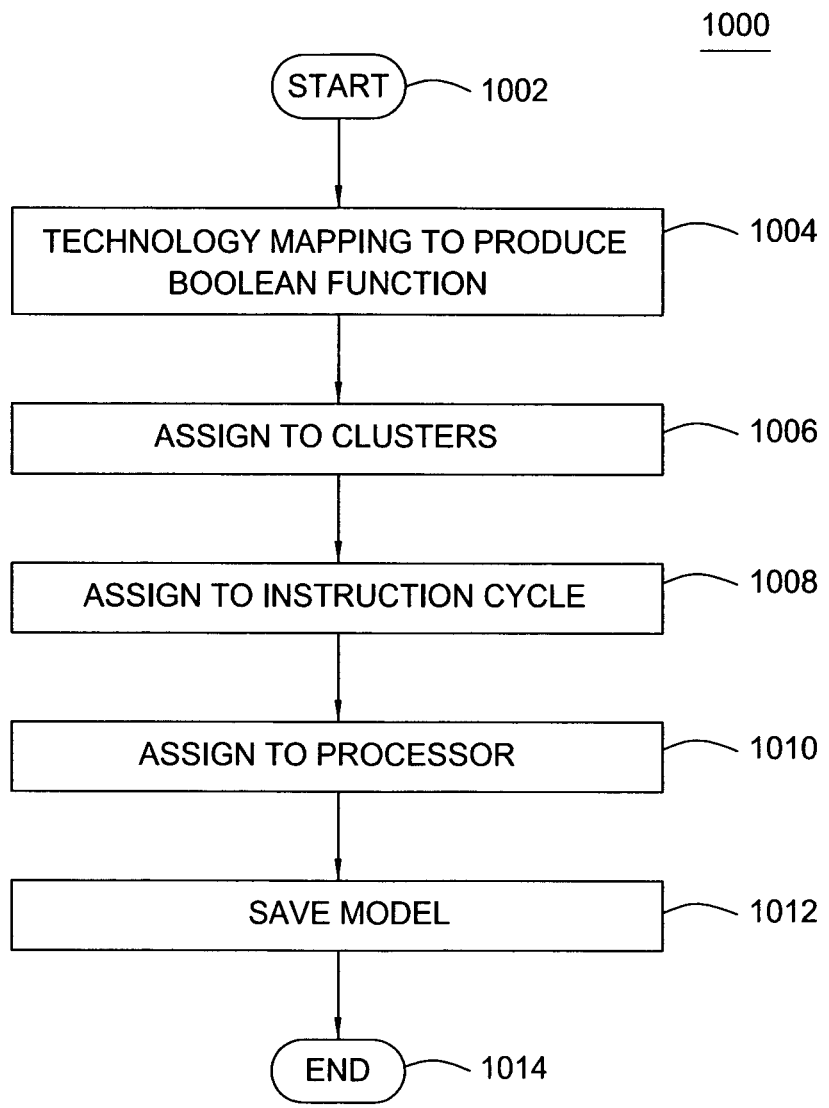
FIG. 10 is a flow diagram of a process utilized by a compiler in accordance with one embodiment of the present invention.

FIG. 10 depicts a flow diagram of a process 1000 utilized by a compiler (shown in FIG. 1 as 114) in accordance with one embodiment of the present invention. The compiler 114 translates a design under verification (hardware design) into instructions that can be stored in the instruction memories 308/310/312/320/322 and evaluated by the processors 302/304/306.

The process 1000 begins at block 1002 and proceeds through a series of steps to convert the hardware design into a sequence of instructions. At block 1004, the compiler employs technology mapping to reduce the variety of arithmetic and logic operations to Boolean functions. The number of operands present in the Boolean function cannot exceed a fixed value. Generally, the number of operands present in the Boolean function are equal to the number of input ports on each processor. In one embodiment, the Boolean function has a maximum of four operands to match four input ports present on each processor.

At partitioning block 1006, the Boolean functions produced by technology mapping step 1004 are assigned to heterogeneous clusters of processors 202. The compiler attempts to uniformly distribute the Boolean functions between all available heterogeneous clusters of processors 202 and also attempts to minimize the amount of communication between heterogeneous clusters of processors 202. At instruction scheduling block 1008, the Boolean functions assigned to each heterogeneous cluster of processors 202 are further assigned to various instruction cycles of the cluster. The compiler must assure the cause-and-effect relationships between the Boolean functions are consistent with the sequences of instruction cycles at which these operations are scheduled. For example, if Boolean function A depends on the evaluation of Boolean function B, then Boolean function B must be evaluated in an instruction cycle before function A is evaluated. The compiler attempts to minimize the overall number of instruction cycles needed to execute the entire model because the performance of the emulation system 100 is inversely proportional to the number of necessary instruction cycles.

At timing-driven intra-cluster placement and routing block 1010, the Boolean functions assigned to the same instruction cycle in the same cluster are further assigned to processors 302/304/306 that constitute the cluster 202. The compiler is aware that each processor 302/304/306 in the cluster 202 serves a unique purpose. Only data fetch processors 302 are capable of retrieving data from the data array 314. Only data store processors 304 are capable of writing data to the data array 314. Data fetch processors 304 can implement the functions that receive their input from outside an identified set of Boolean functions, while data store processors 304 can implement the functions whose output values are consumed outside of the identified set of Boolean functions.

Model saving block 1012 results in a sequence of instructions computed by the compiler in block 1004 to 1010 stored in a persistent form on a medium that can be used conveniently for downloading the instructions into emulation system. The methods of such storage on various kinds of media are well known to those skilled in the art. The process 1000 ends at block 1014.

The compiler must ensure that data is retrieved by the data fetch processor 302 from the data array 314, evaluated, and then stored back to the data array 314 by a data store processor 306 within one instruction cycle time. The compiler must take into account the total propagation delay of a signal through a heterogeneous cluster of processors 202 when assigning an instruction to a particular processor 302/304/306 within the cluster 202. The time for an instruction to execute includes the evaluation time by a particular processor 302/304/306, as well as the delay the signal experiences on an intracluster crossbar 300. The total time for an instruction to execute cannot exceed the total time allocated for one emulation step. Since the ability of compiler to meet this limitation in step 1008 is strongly dependent on the configuration of the set of logic gates identified in steps 1004 and 1006, in some embodiments of the present invention these steps are executed in cooperative fashion, possibly through several iterations until the desired result is achieved.

As an alternative embodiment of the present invention, the instruction cycle time may be determined by the best result compiler could achieve in minimizing the propagation delay through a cluster 202. As another alternative, the emulation system 100 can assign different cycle times to different instructions in view of the results calculated by compiler.

A benefit of the present invention is that the number of processors present on an emulation board can be increased without a substantial increase in the amount of memory present on the emulation board. Only a portion of the processors on the emulation board require direct access to the memory. The size of the memory is directly dependent upon the number of processors which can read from the memory. A heterogeneous cluster of processors, where only certain processors can read from the memory, allows for a total increase of processors on the emulation board because the total amount of memory does not have to correspondingly increase.

While the foregoing is directed to embodiments of the present invention, other and further embodiments of the invention may be devised without departing from the basic scope thereof, and the scope thereof is determined by the claims that follow.

The invention claimed is:

1. An apparatus for emulating a hardware design, comprising:
   a data array memory;
   an intracluster crossbar;
   a plurality of processors in a heterogeneous cluster coupled to the intracluster crossbar;
   a data fetch processor of the plurality of processors configured to, within one instruction cycle time,
      retrieve data from the data array memory, and
      write the data to the intracluster crossbar;
   a data store processor of the plurality of processors configured to, within the one instruction cycle time,
      select the data from the intracluster crossbar, and
      store the data in the data array memory; and
   an intercluster memory configured to store control bits used to select the data from the intracluster crossbar and from an intercluster crossbar operatively connected to the intercluster memory.

2. The apparatus of claim 1 further comprising:
   a data fetch instruction memory coupled to the data fetch processor; and
   a data store instruction memory coupled to the data store processor.

3. The apparatus of claim 2 further comprising a sequencer configured to provide timing to the data fetch instruction memory, the data store instruction memory and the data array memory.

4. The apparatus of claim 1 wherein the plurality of processors includes a computation processor coupled to the intracluster crossbar.

5. The apparatus of claim 4 further comprising a computation instruction memory coupled to the computation processor.

6. The apparatus of claim 5 further comprising a sequencer configured to provide timing to at least one of the data fetch instruction memory, the data store instruction memory, the data array memory, and the computation instruction memory.

7. The apparatus of claim 1 wherein the intracluster crossbar comprises at least one multiplexer.

8. The apparatus of claim 1 wherein the intracluster crossbar comprises an external connection for communication to at least one external hardware device and an intercluster crossbar connection to an intercluster crossbar.

9. The apparatus of claim 8 further comprising an external communication control configured to provide selected data to the external connection.

10. The apparatus of claim 8 further comprising an intercluster memory configured to provide selected data to the intercluster crossbar connection.

11. A method for emulating a hardware design comprising;
    providing a data array memory, an intracluster crossbar, and a plurality of processors in a heterogeneous cluster, each of the plurality of processors coupled to the data array memory and the intracluster crossbar;
    storing, at an intercluster memory operatively connected to the intracluster crossbar and an intercluster crossbar, one or more control bits used to select data from the intracluster crossbar and from the intercluster crossbar;
    configuring a data fetch processor of the plurality of processors to retrieve data from the data array memory, and configuring a data store processor of the plurality of processors to store data in the data array memory;
    using the data fetch processor to retrieve data from the data array memory, within one instruction cycle time;
    evaluating the retrieved data using at least one of the data fetch processor, a computation processor of the plurality of processors and the data store processor to produce an output bit;
    supplying the output bit to the intracluster crossbar; and
    using the data store processor to store the output bit in the data array memory, within the one instruction cycle time.

12. The method of claim 11 further comprising using, by the data fetch processor, an instruction word supplied by a data fetch memory, wherein the instruction word comprises a read address for accessing data from the data array memory.

13. The method of claim 12 further comprising using, by the data store processor, a second instruction word supplied by a data store memory to store the output bit in the data array memory, wherein the second instruction word comprises a second read address for accessing data from the intracluster crossbar.

* * * * *